(12) United States Patent
Reilly

(10) Patent No.: US 11,950,082 B2
(45) Date of Patent: Apr. 2, 2024

(54) METHOD AND APPARATUS FOR AUDIO PROCESSING

(71) Applicant: DOLBY LABORATORIES LICENSING CORPORATION, San Francisco, CA (US)

(72) Inventor: Andrew P. Reilly, Hurlstone Park (AU)

(73) Assignee: DOLBY LABORATORIES LICENSING CORPORATION, San Francisco, CA (US)

( * ) Notice: Subject to any disclaimer, the term of this patent is extended or adjusted under 35 U.S.C. 154(b) by 227 days.

(21) Appl. No.: 17/635,125

(22) PCT Filed: Aug. 14, 2020

(86) PCT No.: PCT/US2020/046261
§ 371 (c)(1),
(2) Date: Feb. 14, 2022

(87) PCT Pub. No.: WO2021/034625
PCT Pub. Date: Feb. 25, 2021

(65) Prior Publication Data
US 2022/0345841 A1    Oct. 27, 2022

Related U.S. Application Data

(60) Provisional application No. 62/888,043, filed on Aug. 16, 2019.

(30) Foreign Application Priority Data

Aug. 16, 2019 (EP) .................................. 19192110

(51) Int. Cl.
*H04R 7/00*      (2006.01)
*H03G 5/16*      (2006.01)
*H04S 7/00*      (2006.01)

(52) U.S. Cl.
CPC ............. *H04S 7/301* (2013.01); *H03G 5/165* (2013.01); *H04S 7/307* (2013.01)

(58) Field of Classification Search
CPC ......... H04S 7/301; H04S 7/307; H03G 5/165; H04R 1/22; H04R 3/04
(Continued)

(56) References Cited

U.S. PATENT DOCUMENTS 6,760,451 B1 *  7/2004  Craven .................. H03G 5/005
                                                        381/59
9,264,834 B2    2/2016  Soulodre
(Continued)

FOREIGN PATENT DOCUMENTS

EP      2028884 B1      10/2009
WO      2003107719 A1   12/2003

OTHER PUBLICATIONS

Goldberg, A. et al."Statistical Analysis of an Automated In-Situ Frequency Response Optimisation Algorithm for Active Loudspeakers" May 23-25, 2003, AES 23rd International Conference, Copenhagen, Denmark, pp. 1-32.

*Primary Examiner* — Vivian C Chin
*Assistant Examiner* — Douglas J Suthers

(57) ABSTRACT

An apparatus and method of loudspeaker equalization. The method combines default tunings (generated based on a default listening environment) and room tunings (generated based on an end user listening environment) to result in combined tunings that account for differences between the end user listening environment and the default listening environment.

28 Claims, 3 Drawing Sheets

(58) Field of Classification Search
USPC .................................................. 381/303, 94.9
See application file for complete search history.

(56) References Cited

U.S. PATENT DOCUMENTS

| | | | |
|---|---|---|---|
| 10,187,504 B1 | 1/2019 | Ramprashad | |
| 2005/0207592 A1 | 9/2005 | Sporer | |
| 2006/0067535 A1 | 3/2006 | Culbert | |
| 2007/0025559 A1 | 2/2007 | Mihelich | |
| 2009/0052680 A1* | 2/2009 | Wang | H04S 7/305 381/59 |
| 2010/0278351 A1 | 11/2010 | Fozunbal | |
| 2010/0290643 A1 | 11/2010 | Mihelich | |
| 2015/0016642 A1 | 1/2015 | Walsh | |

* cited by examiner

METHOD AND APPARATUS FOR AUDIO PROCESSING

CROSS REFERENCE TO RELATED APPLICATIONS

This application claims priority to United States Provisional Patent Application No. 62/888,043, filed Aug. 16, 2019 and European Patent Application No. 19192110.5, filed Aug. 16, 2019, each of which is hereby incorporated by reference in its entirety.

FIELD

The present disclosure relates to audio processing, and in particular, to loudspeaker tuning.

BACKGROUND

Unless otherwise indicated herein, the approaches described in this section are not prior art to the claims in this application and are not admitted to be prior art by inclusion in this section.

It is generally desirable for a loudspeaker to have a flat frequency response. As part of the manufacturing process, the impulse response of the loudspeaker may be measured, and the tuning for the loudspeaker may be calibrated to result in the flat frequency response.

It is generally desirable for the flat frequency response of the loudspeaker to be maintained during operation (e.g., in a listener's home). However, the characteristics of the listener's room or other listening environment will differ from those of the room used during the calibration process. As a result, the listener may perceive other than the flat frequency response.

To address this issue, some systems use a microphone to measure the loudspeaker output at one or more locations in the listening environment, in order to adjust the tuning of the loudspeaker. This process may generally be referred to as environmentally-aware loudspeaker equalization.

SUMMARY

Given the above, there is a need for additional ways to adjust the frequency response of a loudspeaker to account for the listening environment. Embodiments described herein are directed toward using an on-device microphone and adjusting the loudspeaker tuning to account for a late path impulse response of the loudspeaker.

According to an embodiment, a method processes audio. The method includes providing an apparatus having one or more loudspeakers, a memory and a microphone. The memory is configured to store a first plurality of loudspeaker tunings, and the first plurality of loudspeaker tunings corresponds to a first room impulse response of the one or more loudspeakers measured in a first room. The method further includes outputting, in a second room different from the first room, a plurality of audio signals by the one or more loudspeakers of the apparatus using the first plurality of loudspeaker tunings. The method further includes receiving, in the second room, the plurality of audio signals by the microphone of the apparatus. The method further includes computing, by the apparatus, a second room impulse response based on the plurality of audio signals having been received by the microphone, wherein the second room impulse response includes an early response and a late response. The method further includes computing, by the apparatus, a second plurality of loudspeaker tunings based on the second room impulse response wherein the second plurality of loudspeaker tunings is based on the late response and excludes the early response. The method further includes combining the first plurality of loudspeaker tunings and the second plurality of loudspeaker tunings to generate a third plurality of loudspeaker tunings. The method further includes outputting an audio signal by the one or more loudspeakers of the apparatus using the third plurality of loudspeaker tunings.

The first plurality of loudspeaker tunings may result in a flat frequency response of the one or more loudspeakers in the first room. Different acoustic characteristics between the first room and the second room may result in the first room impulse response differing from the second room impulse response. The plurality of audio signals output in the second room may correspond to a plurality of exponential sine sweeps.

The one or more loudspeakers may correspond to a left loudspeaker and a right loudspeaker. The apparatus may have the form factor of a sound bar. The one or more loudspeakers may include at least one wireless loudspeaker.

The first room impulse response may include an early response and a late response, where the first plurality of loudspeaker tunings is based on the early response. The second room impulse response may include an early response and a late response, where the second plurality of loudspeaker tunings is based on the late response, or where the second plurality of loudspeaker tunings excludes the early response.

The second room impulse response may include an early response and a late response, where the early response includes a direct response and a first indirect response. The direct response may correspond to a direct path between each of the one or more loudspeakers and the microphone. The first indirect response may correspond to a first indirect path between each of the one or more loudspeakers and the microphone, where the first indirect response is related to a first time range. The late path response may correspond to a second indirect path between each of the one or more loudspeakers and the microphone, where the late path response is related to a second time range that follows the first time range.

In an embodiment, the one or more loudspeakers and the microphone are integrated into a single housing of the apparatus.

In an embodiment, the third plurality of loudspeaker tunings may correspond to merging the early response of the first room impulse response with the late response of the second room impulse response. For example, combining the first plurality of loudspeaker tunings and the second plurality of loudspeaker tunings to generate the third plurality of loudspeaker tunings is performed by merging the early response of the first room impulse response with the late response of the second room impulse response.

In an embodiment, combining the first plurality of loudspeaker tunings and the second plurality of loudspeaker tunings is performed in the log domain using an average of the spectral magnitudes of the first plurality of loudspeaker tunings and second plurality of loudspeaker tunings.

In an embodiment, combining the first plurality of loudspeaker tunings and the second plurality of loudspeaker tunings uses first weights associated with the spectral magnitudes of the first plurality of loudspeaker tunings and second weights associated with the spectral magnitudes of second plurality of loudspeaker tunings for obtaining a weighted average.

The method may further include a configuration process prior to providing the apparatus. The configuration process may include outputting, in the first room, a plurality of test signals by the one or more loudspeakers of the apparatus. The configuration process may further include receiving, in the first room, the plurality of test signals. The configuration process may further include computing the first room impulse response based on the plurality of test signals having been received, computing the first plurality of loudspeaker tunings based on the first room impulse response, and storing, in the memory of the apparatus, the first plurality of loudspeaker tunings.

In an embodiment, the plurality of audio signals used for computing the second impulse response are generated from general audio output played back by the apparatus. Computing the second impulse room response may be performed substantially concurrently with playing back the general audio output. For example, According to another embodiment, a non-transitory computer readable medium stores a computer program comprising instructions that, when executed by a processor, controls an apparatus to execute processing including one or more of the methods discussed above.

According to another embodiment, an apparatus processes audio. The apparatus includes one or more loudspeakers, a microphone, a processor and a memory. The memory is configured to store a first plurality of loudspeaker tunings, where the first plurality of loudspeaker tunings corresponds to a first room impulse response of the one or more loudspeakers measured in a first room. The processor is configured to control the one or more loudspeakers to output, in a second room different from the first room, a plurality of audio signals using the first plurality of loudspeaker tunings. The processor is configured to control the microphone to receive, in the second room, the plurality of audio signals. The processor is configured to compute a second room impulse response based on the plurality of audio signals having been received by the microphone, wherein the second room impulse response includes an early response and a late response. The processor is configured to compute a second plurality of loudspeaker tunings based on the second room impulse response wherein the second plurality of loudspeaker tunings is based on the late response and excludes the early response. The processor is configured to combine the first plurality of loudspeaker tunings and the second plurality of loudspeaker tunings to generate a third plurality of loudspeaker tunings. The processor is configured to control the one or more loudspeakers to output an audio signal using the third plurality of loudspeaker tunings.

The apparatus may include similar details to those discussed above regarding the method.

As a result, embodiments result in loudspeaker tunings that take into account the user's listening environment.

The following detailed description and accompanying drawings provide a further understanding of the nature and advantages of various implementations.

DETAILED DESCRIPTION

Described herein are techniques for loudspeaker equalization. In the following description, for purposes of explanation, numerous examples and specific details are set forth in order to provide a thorough understanding of the present disclosure. It will be evident, however, to one skilled in the art that the present disclosure as defined by the claims may include some or all of the features in these examples alone or in combination with other features described below, and may further include modifications and equivalents of the features and concepts described herein.

In the following description, various methods, processes and procedures are detailed. Although particular steps may be described in a certain order, such order is mainly for convenience and clarity. A particular step may be repeated more than once, may occur before or after other steps (even if those steps are otherwise described in another order), and may occur in parallel with other steps. A second step is required to follow a first step only when the first step must be completed before the second step is begun. Such a situation will be specifically pointed out when not clear from the context.

In this document, the terms "to store", "stored" and "storing" are used. In general, these terms may be used to refer to an active verb (e.g., the process of storing, or changing from an un-stored state to a stored state), to a state of being (e.g., the state of being stored), or both. For example, "storing data" may be used to describe the process of storing (e.g., the data transitioning from the un-stored state to the stored state). As another example, "storing data" may be used to describe the current state of data (e.g., the data currently exists in the stored state as a result of being previously stored). When only a single interpretation is meant, such meaning will be apparent from the context.

In this document, the terms "and", "or" and "and/or" are used. Such terms are to be read as having an inclusive meaning. For example, "A and B" may mean at least the following: "both A and B", "at least both A and B". As another example, "A or B" may mean at least the following: "at least A", "at least B", "both A and B", "at least both A and B". As another example, "A and/or B" may mean at least the following: "A and B", "A or B". When an exclusive-or is intended, such will be specifically noted (e.g., "either A or B", "at most one of A and B").

Figure 1:
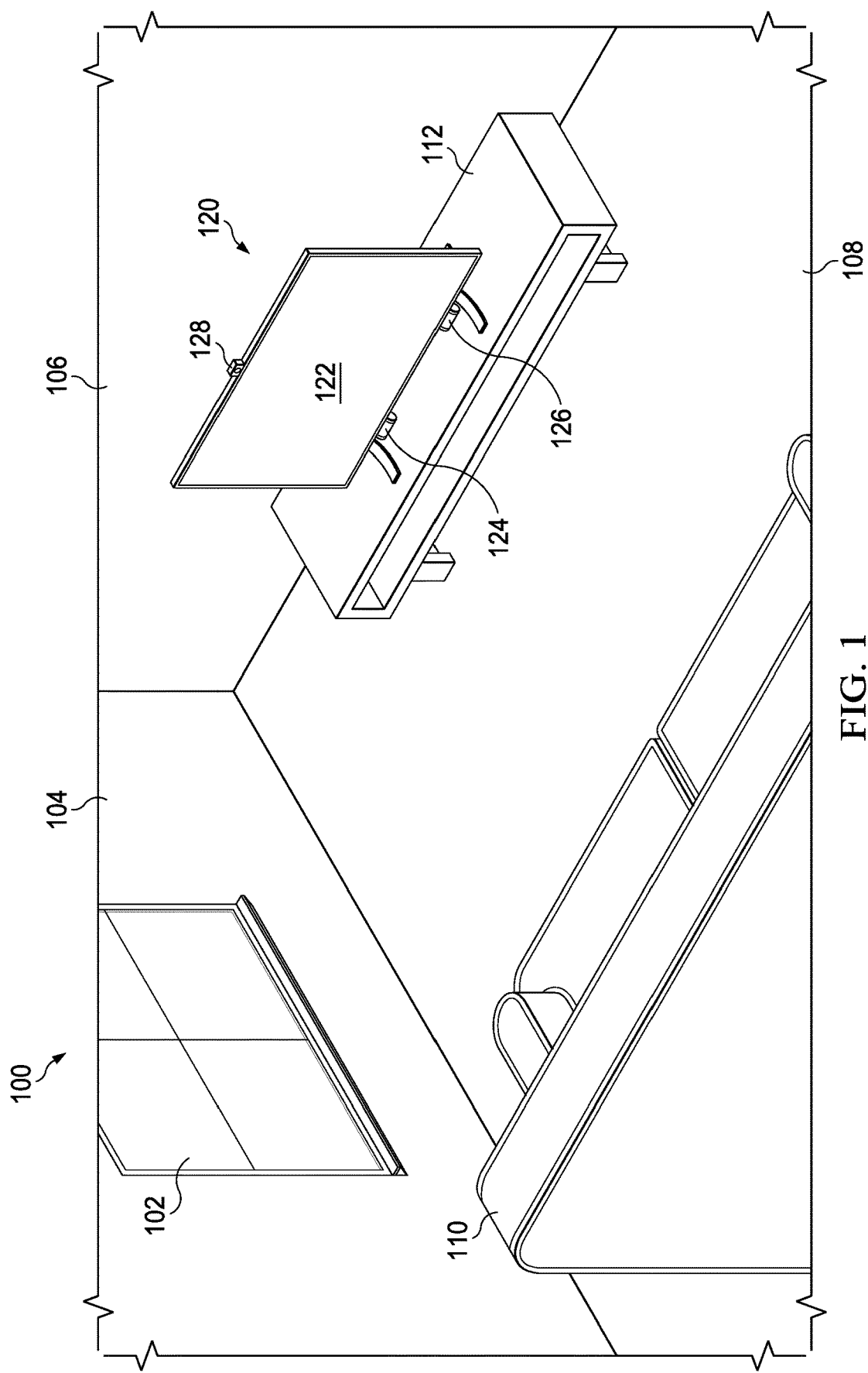
FIG. 1 shows a perspective view of a listening environment 100.

FIG. 1 shows a perspective view of a listening environment 100. The listening environment 100 may be a room in a listener's house, such as a family room, living room, home entertainment center, bedroom, etc. The listening environment 100 includes a number of interesting acoustic features. Example acoustic features shown in FIG. 1 include a window 102, walls 104 and 106, a floor 108, a couch 110, a table 112, etc. (Other acoustic features such as the other walls, ceiling, etc. are not shown.)

A television 120 is located on the table 112. The television 120 includes a screen 122, loudspeakers 124 and 126, and a microphone 128. The screen 122 may be a liquid crystal display (LCD). As shown in FIG. 1, the loudspeakers 124 and 126 are configured as left and right stereo loudspeakers. The loudspeakers 124 and 126 may be configured in other arrangements. The loudspeakers 124 and 126 may be configured as a single loudspeaker or as two loudspeakers that are associated with additional loudspeakers (not shown). For example, the loudspeakers 124 and 126 may be in the form factor of a sound bar. The television 120 may be associated with additional loudspeakers, for example wireless loudspeakers (e.g., a wireless subwoofer) that is associated with the loudspeakers 124 and 126.

The microphone 128 is generally used to capture the acoustics of the listening environment 100, as further described herein. The microphone 128 may be used for additional functionality related to the television 120, for example to receive voice commands, etc. The microphone 128 is shown in the top center of the television 120 in FIG. 1, but the microphone 128 may be located in other positions, such as the top left corner, the top right corner, the left center, the right center, etc.

Figure 2:
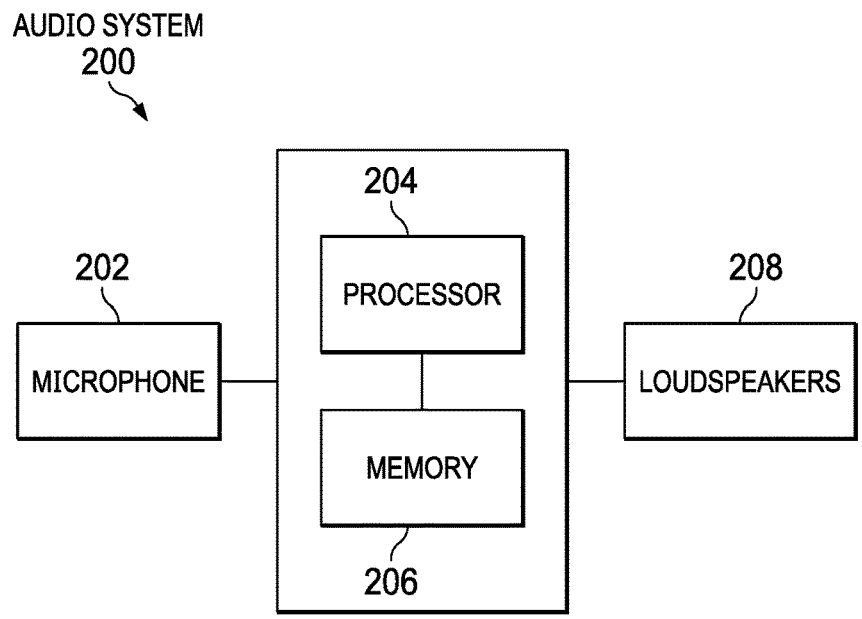
FIG. 2 shows a block diagram of an embodiment of an apparatus, referred to as an audio system 200.

FIG. 2 shows a block diagram of an embodiment of an apparatus, referred to as an audio system 200. The audio system 200 may be implemented in the television 120 (see FIG. 1), or in another form factor such as that of a sound bar. In general, the audio system 200 controls the operation of the device it is implemented in (such as the television 120), including implementing the equalization functionality described herein. The audio system 200 includes a microphone 202, a processor 204, a memory 206, and one or more loudspeakers 208. The audio system 200 may also include additional components (not shown) and implement additional functionality, such as various inputs (antenna, cable, internet protocol, high definition multimedia interface (HDMI), infrared, wireless, etc.), various outputs (HDMI, optical, wireless, etc.), remote control functionality, video processing functionality (e.g., for the screen 122 of FIG. 1, etc.).

The microphone 202 generally receives auditory inputs generally corresponding to the acoustics of the listening environment (e.g., the listening environment 100 of FIG. 1). During an equalization process (further described herein), the microphone 202 receives auditory inputs (resulting from the audio system 200 outputting signals using the one or more loudspeakers 208) that are affected by the acoustics of the listening environment. The microphone 202 may also receive auditory inputs related to other functionality of the audio system 200. For example, the audio system 200 may implement voice command functionality, in which case the microphone 202 receives the voice commands.

The processor 204 generally controls the operation of the audio system 200, including controlling the equalization process. The processor 204 may execute one or more computer programs as part of its operation. The processor 204 may include a digital signal processor (DSP) or may implement DSP functionality, for example to process the signals received by the microphone 202 or to compute the data used in the equalization process.

The memory 206 generally stores data used by the audio system 200. The memory 206 may interface with the processor 204 to provide data to the processor 204 or to store processed data from the processor 204. The memory 206 may include volatile components (e.g., random access memory), non-volatile memory (e.g., flash memory), etc. The memory 206 may store data resulting from the equalization process, such as a set of factory equalization settings, a set of modified equalization settings, etc.

The one or more loudspeakers 208 generally output audio signals into the listening environment (e.g., the listening environment 100 of FIG. 1). The audio signals may include the test signals used during the equalization process. The one or more loudspeakers 208 may include two stereo loudspeakers, four loudspeakers (e.g., front and side on the left, and front and side on the right), six loudspeakers (e.g., front, side and top on the left, and front, side and top on the right), etc. The one or more loudspeakers 208 may be integrated into a single housing with the other components of the audio system 200, or the one or more loudspeakers 208 may be connected to the other components of the audio system 200 via a cable or other connector (e.g., an optical cable). The one or more loudspeakers 208 may be configured in the form factor of a sound bar. The one or more loudspeakers 208 may include one or more wireless loudspeakers (e.g., a wireless subwoofer).

Figure 3:
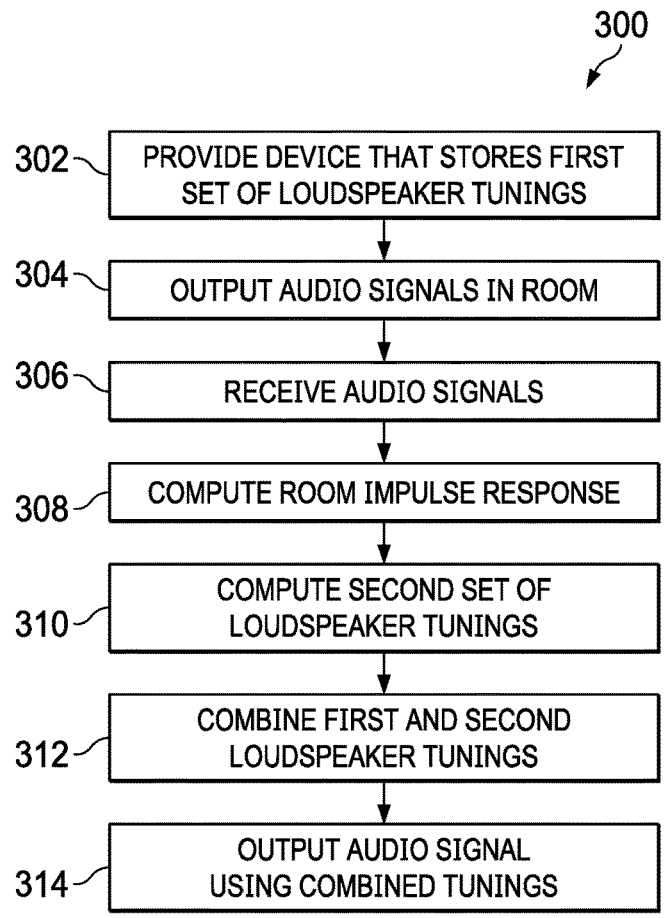
FIG. 3 shows a flow diagram of an embodiment of a method 300 of audio processing.

FIG. 3 shows a flow diagram of an embodiment of a method 300 of audio processing. The method 300 may be performed by the audio system 200 (see FIG. 2), as implemented in the television 120 (see FIG. 1), for example as controlled according to one or more computer programs. In general, the method 300 is directed to the operation of the audio system 200 in the listening environment (e.g., the listening environment 100 of FIG. 1).

At 302, a device (also referred to as an apparatus) having one or more loudspeakers, a memory and a microphone is provided. For example, the device may be the television 120 that includes the audio system 200 (including the loudspeakers 208, the memory 206 and the microphone 202). The memory is configured to store a first plurality of loudspeaker tunings. The first plurality of loudspeaker tunings corresponds to a first room impulse response of the one or more loudspeakers measured in a first room. In general, the first plurality of loudspeaker tunings corresponds to a set of factory tunings or default tunings that result during the manufacturing process or otherwise prior to use by the end user; the first room corresponds to the audio environment associated with making these measurements. For example, the loudspeaker tunings may correspond to boosts and cuts in one or more of the frequency bands (e.g., of 20 total bands) for each of the loudspeakers. (Further details for the factory tunings are provided in other sections herein.)

At 304, in a second room different from the first room, a plurality of audio signals are output by the one or more loudspeakers of the device using the first plurality of loudspeaker tunings (see 302). For example, the loudspeakers 208 may output the plurality of audio signals. The second room may correspond to the listener's audio environment such as the listening environment 100. The audio signals output at this point may be referred to as test signals. (Further details for the test signals are provided in other sections herein.)

At 306, in the second room, the plurality of audio signals (see 304) are received by the microphone of the device. For example, the microphone 202 may receive the audio signals in the listening environment 100. The audio signals may be received on a direct path, an early path and a late path (see also FIG. 4). The direct path corresponds to the line between each of the loudspeakers and the microphone, and will generally have the largest magnitude. The early path includes signals received before a defined time, and generally corresponds to a first set of indirect signals or reflections (e.g., off the walls, ceiling, etc.) between each of the loudspeakers and the microphone. (The direct path may also be considered part of the early path, if one defines the early path as including both the direct and indirect signals received before the defined time.) The late path includes signals received after the defined time, and generally corresponds to a second set of indirect signals or reflections between each of the loudspeakers and the microphone.

At 308, a second room impulse response is computed, by the device, based on the plurality of audio signals having been received by the microphone (see 306). For example, the processor 204 (see FIG. 2) may compute the second room impulse response. In general, since the second room differs from the first room, the impulse response of the second room will differ from that of the first room. The second room impulse response includes an early response and a late response. The early response corresponds to the early path signals (and optionally also the direct path signals), and the late response corresponds to the late path signals.

At 310, a second plurality of loudspeaker tunings is computed, by the device, based on the second room impulse response (see 308). For example, the processor 204 may compute the second plurality of loudspeaker tunings, which may be referred to as the room tunings. As further detailed in other sections herein, the second plurality of loudspeaker tunings may be based on the late room response (but not the early room response) of the second room. (Further details of computing these loudspeakers tunings are provided below with reference to FIG. 5.)

At 312, the first plurality of loudspeaker tunings (see 302) and the second plurality of loudspeaker tunings (see 310) are combined to generate a third plurality of loudspeaker tunings. For example, the processor 204 may combine the default tunings and the room tunings to generate combined tunings.

At 314, an audio signal is output by the one or more loudspeakers of the device using the third plurality of loudspeaker tunings (see 312). For example, the loudspeakers 208 may output an audio signal using the combined tunings.

Figure 4:
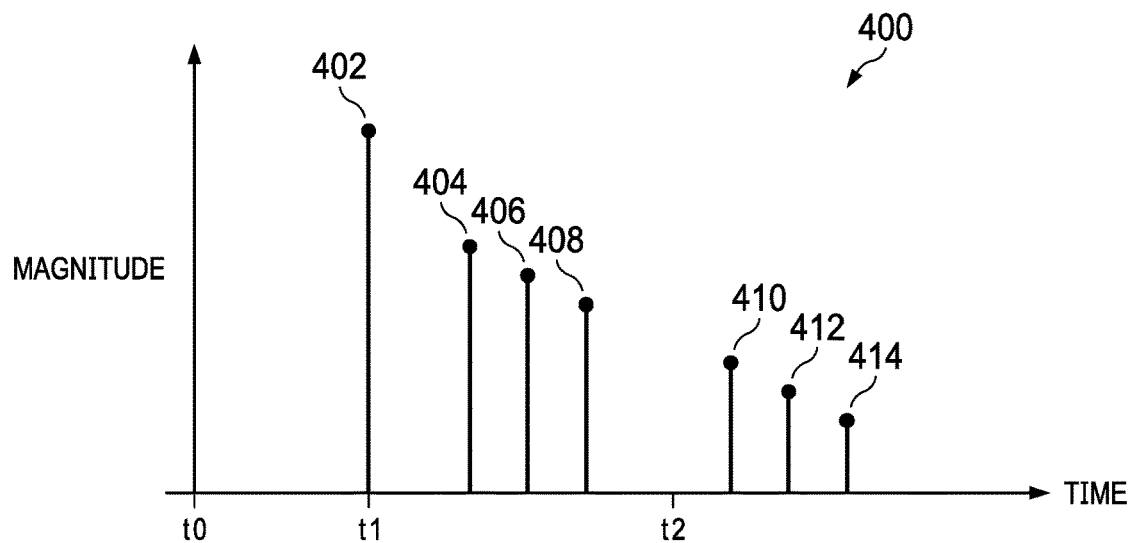
FIG. 4 shows a graph 400 showing the direct path, early path and late path signals.

FIG. 4 shows a graph 400 showing the direct path, early path and late path signals (see 306 in FIG. 3). The graph 400 has an x-axis showing time and a y-axis showing magnitude. In general, the time of each signal corresponds to the distance traveled by each signal from each loudspeaker to the microphone, according to the speed of sound. For ease of illustration, the signals for one loudspeaker are shown, as stylized impulse responses that are limited in number. (The actual signals will often be more complex, for example as including multiple frequency components and being slightly spread over time.)

At time t0, the audio system (e.g., the audio system 200 of FIG. 2) outputs a test signal from a loudspeaker. At time t1, in response to the test signal, the microphone receives a direct path signal 402. The time t1 generally corresponds to the distance between the loudspeaker and the microphone (e.g., 50 cm).

The early path signals 404, 406 and 408 occur after time t1 and before time t2. The early path signals 404, 406 and 408 correspond to a first set of reflected signals (e.g., off the walls, ceiling, etc.). In general, the time t2 corresponds to a defined distance, such as 4 m, in which case the time t2 corresponds to 11.66 ms (using 343 m/s as the speed of sound). Thus, the first set of reflected signals are those that travel less than the defined distance. In general, the defined distance corresponds to an assumed room size. For example, when the loudspeaker and microphone are 1.5 m from two walls and the floor, the first set of reflected signals from those surfaces travels 3 m, which is within the defined distance of 4 m. The defined distance may be adjusted as desired (resulting in corresponding changes to t2).

The time period between t1 and t2 may be referred to as the early response or the early part of the impulse response. Alternatively, the early response may refer to the time period between t0 and t2.

The late path signals 410, 412 and 414 occur after time t2. The late path signals 410, 412 and 414 correspond to a second set of reflected signals that travel more than the defined distance. As compared to the first set of reflected signals, the second set of reflected signals may be viewed as the general wash of reverberations around the room, often reflecting off multiple surfaces such that their travel distance is greater than the defined distance.

The time period after t2 (until a defined end point) may be referred to as the late response or the late part of the impulse response.

Besides using the defined distance to define the time t2 to demarcate the early response from the late response, a number of other alternatives may be used. One alternative is by inspection, by measuring the time delay between the initial impulse (e.g., the direct path signal 402) and the first strong peak (e.g., the early path signal 404), and then doubling or tripling that time delay. Another alternative is to adjust the defined distance according to user input, for example by increasing or decreasing a room size value.

The following sections provide more details of the functionality of the audio system 200 (see FIG. 2). This functionality may be generally categorized as configuration details and operational details.

Configuration Details

The configuration details generally refer to operations that occur during development or manufacturing of the device that contains the audio system 200 (e.g., the television 120 of FIG. 1), for example prior to the device being used in the end user's listening environment. For example, the configuration process may be performed prior to the method 300 (see FIG. 3) in order to generate the default tunings (see 302). One goal of the configuration process is to give the loudspeakers of the device a generally flat frequency response. The configuration process may be controlled by a configuration system (e.g., a computer).

To perform the configuration process, the configuration system measures the impulse response of each loudspeaker of the device using test signals. The measurement may be performed in a room that has similar reverberation characteristics to those of a listening environment of an end user (referred to as an idealized room or presumed listening environment). Alternatively, the measurement may be performed in an anechoic room. The configuration system may use a microphone placed on-axis 1 m in front of the device (e.g., an assumed listener position) to perform the measurement. The microphone may capture the near-field anechoic impulse response of each loudspeaker. The configuration system may use frequency domain deconvolution to compute the impulse response.

Then for each loudspeaker, the configuration system computes a correction curve based on the impulse response. To compute the correction curve, the configuration system first computes a power spectrum of the impulse response. The configuration system may use Welch's method for spectral density estimation, using a sliding overlapping window technique; the window overlap may be 50%. Next, the configuration system inverts the power spectrum to obtain the correction curve. For example, if a particular frequency is boosted in the power spectrum, the correction curve results in an attenuation to that frequency. In general, many domestic rooms tend to acoustically boost bass frequencies and attenuate treble frequencies, so the correction curve will tend to attenuate bass frequencies and boost treble frequencies.

The configuration system may use only the early part of the impulse response (as discussed with reference to FIG. 4) to compute the correction curve.

The device may store the correction curve as a set of loudspeaker tunings, also referred to as default tunings or factory tunings, in its memory (e.g., the memory 206 of FIG. 2). The set of loudspeaker tunings may organize the frequencies of the correction curve into bins, may sample the correction curve at bin center frequencies, may average the samples into bands, may convert the averaged samples into the log domain, and may associate a coefficient with each log domain sample. The set of loudspeaker tunings then correspond to the set of coefficients that are applied to the various frequency bins.

By applying the correction curve to the loudspeaker signals, the device obtains a generally flat frequency response.

Operational Details

Figure 5:
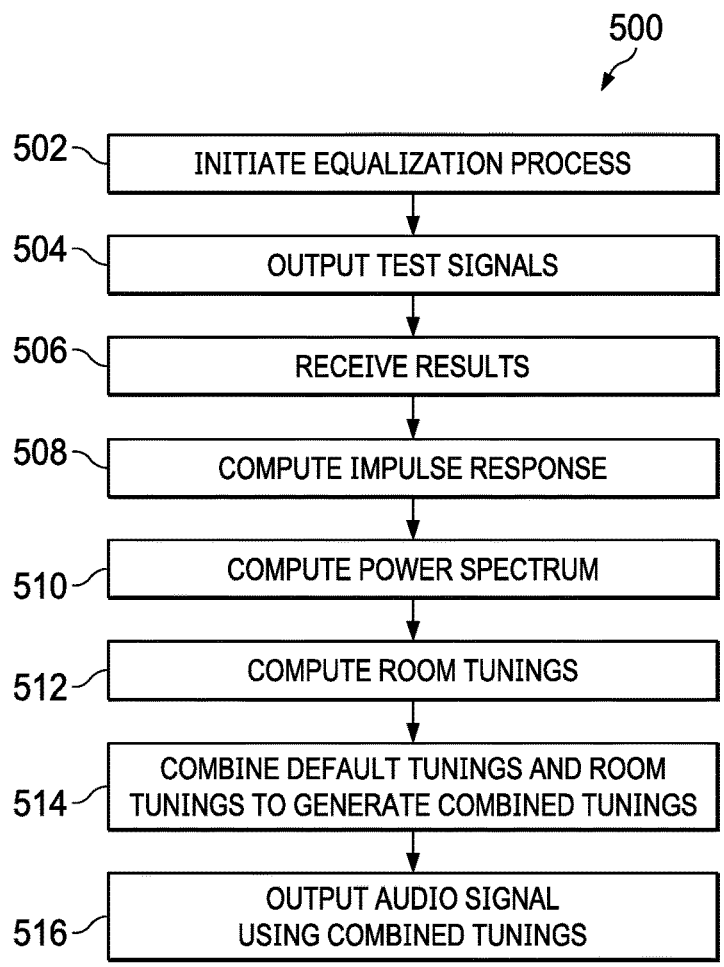
FIG. 5 shows a flow diagram of an embodiment of a method 500 of audio processing.

FIG. 5 shows a flow diagram of an embodiment of a method 500 of audio processing. The method 500 describes an example of the operational details of the device that implements the audio system 200 of FIG. 2 (e.g., the television 120 of FIG. 1). The operational details generally refer to operations that the audio system 200 performs in the listening environment (e.g., when the television 120 is located in the user's living room). For example, the operational details may provide more details for the method 300 (see FIG. 3), e.g. obtaining a second set of loudspeaker tunings, referred to as room tunings, that is used in combination with the default tunings.

At 502, the device initiates the equalization process, for example according to a user input. Alternatively, the device may initiate the equalization process without user input, for example according to a schedule, when plugged in to power (following an unplugged state), etc. The user input may be via an on-screen prompt (e.g., selected via the remote control), a button on the device, etc. The device may check that the ambient sound level is sufficiently low (e.g., including a screen display requesting silence) prior to performing the equalization process. The device may display an indicator it is performing the equalization process.

At 504, the device outputs audio signals, referred to as test signals, from each of the loudspeakers. The audio signals may include noise bursts (e.g., pink noise), silences, hyperbolically-swept sinusoids (e.g., rising sinusoids), etc. The exact content of the audio signals may be adjusted as desired according to a desired frequency range, a desired timing, a desired channel separation requirement, etc. The audio signals may be selected to conform to user expectations, such as sounding technical, purposeful and not unpleasant.

Alternatively, the equalization process may be performed concurrently with the general audio output functionality of the device, where the general audio output is used instead of test signals. In such a case, the device uses an adaptive echo-cancelling process similar to that used in communication systems. In other words, general audio output may be played back by the apparatus, e.g. as the user desires, and the test signals may be generated from the general audio output so that the equalization process can be performed simultaneously with playing back the general audio output or during playing back the general audio output in a continuous manner.

At 506, the microphone of the device (e.g., the microphone 202 of FIG. 2) receives the results of outputting the audio signals (see 504). These results may be similar to the simplified graph of FIG. 4, with a main peak corresponding to the direct path signal and assorted lesser peaks corresponding to the indirect or reflected path signals. The device may put the microphone into a calibrated mode (e.g., using stored calibration settings) so that the received signal does not clip (e.g., overload or over-voltage) at any stage, but also has sufficient signal to noise level for the subsequent processing.

At 508, the device computes an impulse response based on the received signals (see 506) for the acoustic path for each loudspeaker to the microphone. The device may compute the impulse response using frequency domain deconvolution.

At 510, the device computes a power spectrum of the impulse responses (see 508). The device may compute the power spectrum using only the late part of the impulse responses (e.g., after the time t2 in FIG. 4), excluding the early part of the impulse responses (e.g., before the time t2 in FIG. 4). The device may use Welch's method for spectral density estimation, using a sliding overlapping window technique; the window overlap may be 50%. The device may average the per-loudspeaker power spectra into an average spectrum, referred to as a room spectrum.

Using only the late part of the second room impulse response and excluding the early part (direct paths and also early reflection paths as for example before the time t2 in FIG. 4) of it, makes the equalization process less sensitive to the location of the microphone relative to the one or more loudspeakers. The early response contains information about the relative location of the microphone in the room. By ignoring the early response and using only the late response of the second room impulse response, the equalization process leads to the computation of loudspeaker tunings which represent an accurate room impulse response without the need to measure multiple responses at different locations of the room (e.g. obtainable by moving the microphone at different listener positions). Since the equalization process is substantially independent from the microphone location, it is possible to arrange the microphone within the apparatus. For example, in an embodiment, the one or more loudspeakers and the microphone are integrated into a single housing of the apparatus. In other words, the microphone is not a separated device, but embedded within the apparatus. The apparatus may be fixed (for example a sound bar or a television such as television 120 of FIG. 1) with limited or no possibility to move the apparatus in the room for equalization purposes. In conventional apparatuses and equalization processes performed by such conventional apparatuses, the microphone is typically arranged at or moved to the listener position for equalization purposes.

Furthermore, excluding the early response, and in particular the early reflections of the early response, from the computation of the second plurality of second loudspeaker tunings, prevents that power spectra with deeply notchy characteristics are generated. Such notchy power spectra characteristics may instead be generated in conventional methods computing the full (early and late) impulse response by performing multiple measurements at multiple locations.

At 512, the device computes a correction curve by inverting the power spectra (see 510). The device may store the correction curve as a set of loudspeaker tunings, also referred to as room tunings, in its memory (e.g., the memory 206 of FIG. 2). The set of loudspeaker tunings may organize the frequencies of the correction curve into bins, may sample the correction curve at bin center frequencies, may average the samples into bands, may convert the averaged samples into the log domain, and may associate a coefficient with each log domain sample. The set of loudspeaker tunings then correspond to the set of coefficients that are applied to the various frequency bins.

At 514, the device combines the default tunings (computed in the configuration process, and stored in the memory) and the room tunings (see 512) to generate combined tunings. The device may combine these tunings in the log domain using an average. Alternatively, the device may combine these tunings in the linear gain domain using a geometric mean. As another alternative, the device may generate the combined tunings using a power spectrum from a time domain splicing of the early part of the first room impulse response and the late part of the second room impulse response. The combined tunings may be represented in the log domain. The device may store the combined tunings in its memory.

There are a number of options for combining the default tunings and the room tunings. A first option is to determine the default tunings using the early part of the impulse responses in the first room and the room tunings using the late part of the impulse responses in the second room, and averaging the two correction curves. A second option is to produce the combined tuning as the minimum of the default tuning and the room tuning, in each frequency bin. A third option is to produce the combined tuning by splicing the early part of the first room impulse response and the late part of the second room impulse response in the log domain, then computing the combined tuning based on the result of the splicing operation. A fourth option is to weight the default tunings and the room tunings using weights other than 1:1. For example, in an embodiment, first weights may be associated with the spectral magnitudes of the first plurality of loudspeaker tunings and second weights may be associated with the spectral magnitudes of second plurality of loudspeaker tunings. For example, the room tunings may be weighted 2:1 versus the default tunings. A weighted average of spectral magnitudes of the first and second plurality of loudspeaker tunings may be computed by taking into account the first and second weights, respectively.

In the various options described for combining the default tunings with the room tunings, a simplified correction mechanism is envisaged compared to conventional methods which typically result in an over correction of the response.

At 516, the device outputs an audio signal using the combined tunings (see 514). For example, the loudspeakers 208 may output an audio signal using the combined tunings.

Each of the tunings (the default tunings, the room tunings and the combined tunings) may be available for use by the device when generating the audio output. For example, once the combined tunings have been generated, the user may select one of the default tunings, the room tunings and the combined tunings to use according to their preference.

As a result, embodiments result in loudspeaker tunings that take into account the user's listening environment.

Implementation Details

An embodiment may be implemented in hardware, executable modules stored on a computer readable medium, or a combination of both (e.g., programmable logic arrays). Unless otherwise specified, the steps executed by embodiments need not inherently be related to any particular computer or other apparatus, although they may be in certain embodiments. In particular, various general-purpose machines may be used with programs written in accordance with the teachings herein, or it may be more convenient to construct more specialized apparatus (e.g., integrated circuits) to perform the required method steps. Thus, embodiments may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such computer program is preferably stored on or downloaded to a non-transitory storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein. (Software per se and intangible or transitory signals are excluded to the extent that they are unpatentable subject matter.)

The above description illustrates various embodiments of the present disclosure along with examples of how aspects of the present disclosure may be implemented. The above examples and embodiments should not be deemed to be the only embodiments, and are presented to illustrate the flexibility and advantages of the present disclosure as defined by the following claims. Based on the above disclosure and the following claims, other arrangements, embodiments, implementations and equivalents will be evident to those skilled in the art and may be employed without departing from the spirit and scope of the disclosure as defined by the claims.

Various aspects of the present invention may be appreciated from the following enumerated example embodiments (EEEs):

1. A method of audio processing, the method comprising:
   providing an apparatus having one or more loudspeakers, a memory and a microphone, wherein the memory is configured to store a first plurality of loudspeaker tunings, wherein the first plurality of loudspeaker tunings corresponds to a first room impulse response of the one or more loudspeakers measured in a first room;
   outputting, in a second room different from the first room, a plurality of audio signals by the one or more loudspeakers of the apparatus using the first plurality of loudspeaker tunings;
   receiving, in the second room, the plurality of audio signals by the microphone of the apparatus;
   computing, by the apparatus, a second room impulse response based on the plurality of audio signals having been received by the microphone;
   computing, by the apparatus, a second plurality of loudspeaker tunings based on the second room impulse response;
   combining the first plurality of loudspeaker tunings and the second plurality of loudspeaker tunings to generate a third plurality of loudspeaker tunings; and
   outputting an audio signal by the one or more loudspeakers of the apparatus using the third plurality of loudspeaker tunings.

2. The method of EEE 1, wherein the first plurality of loudspeaker tunings results in a flat frequency response of the one or more loudspeakers in the first room.

3. The method of any one of EEEs 1-2, wherein different acoustic characteristics between the first room and the second room result in the first room impulse response differing from the second room impulse response.

4. The method of any one of EEEs 1-3, wherein the plurality of audio signals output in the second room corresponds to a plurality of exponential sine sweeps.
5. The method of any one of EEEs 1-4, wherein the one or more loudspeakers correspond to a left loudspeaker and a right loudspeaker.
6. The method of any one of EEEs 1-5, wherein the apparatus has a form factor of a sound bar.
7. The method of any one of EEEs 1-6, wherein the one or more loudspeakers includes at least one wireless loudspeaker.
8. The method of any one of EEEs 1-7, wherein the first room impulse response includes an early response and a late response; and wherein the first plurality of loudspeaker tunings is based on the early response.
9. The method of any one of EEEs 1-8, wherein the second room impulse response includes an early response and a late response; and wherein the second plurality of loudspeaker tunings is based on the late response.
10. The method of any one of EEEs 1-9, wherein the second room impulse response includes an early response and a late response; and wherein the second plurality of loudspeaker tunings excludes the early response.
11. The method of any one of EEEs 1-10, wherein the second room impulse response includes an early response and a late response;
wherein the early response includes a direct response and a first indirect response;
wherein the direct response corresponds to a direct path between each of the one or more loudspeakers and the microphone;
wherein the first indirect response corresponds to a first indirect path between each of the one or more loudspeakers and the microphone, and wherein the first indirect response is related to a first time range; and
wherein the late path response corresponds to a second indirect path between each of the one or more loudspeakers and the microphone, wherein the late path response is related to a second time range that follows the first time range.
12. The method of any one of EEEs 1-11, wherein the first room impulse response includes an early response and a late response;
wherein the second room impulse response includes an early response and a late response;
wherein the third plurality of loudspeaker tunings corresponds to merging the early response of the first room impulse response with the late response of the second room impulse response.
13. The method of any one of EEEs 1-12, further comprising, prior to the step of providing the apparatus:
outputting, in the first room, a plurality of test signals by the one or more loudspeakers of the apparatus;
receiving, in the first room, the plurality of test signals;
computing the first room impulse response based on the plurality of test signals having been received;
computing the first plurality of loudspeaker tunings based on the first room impulse response; and
storing, in the memory of the apparatus, the first plurality of loudspeaker tunings.
14. A non-transitory computer readable medium storing a computer program comprising instructions that, when executed by a processor, controls an apparatus to execute processing including the method of any one of EEEs 1-13.

15. An apparatus for audio processing, the apparatus comprising:
one or more loudspeakers;
a microphone;
a processor; and
a memory,
wherein the memory is configured to store a first plurality of loudspeaker tunings, wherein the first plurality of loudspeaker tunings corresponds to a first room impulse response of the one or more loudspeakers measured in a first room;
wherein the processor is configured to control the one or more loudspeakers to output, in a second room different from the first room, a plurality of audio signals using the first plurality of loudspeaker tunings;
wherein the processor is configured to control the microphone to receive, in the second room, the plurality of audio signals;
wherein the processor is configured to compute a second room impulse response based on the plurality of audio signals having been received by the microphone;
wherein the processor is configured to compute a second plurality of loudspeaker tunings based on the second room impulse response;
wherein the processor is configured to combine the first plurality of loudspeaker tunings and the second plurality of loudspeaker tunings to generate a third plurality of loudspeaker tunings; and
wherein the processor is configured to control the one or more loudspeakers to output an audio signal using the third plurality of loudspeaker tunings.
16. The apparatus of EEE 15, wherein the first plurality of loudspeaker tunings results in a flat frequency response of the one or more loudspeakers in the first room.
17. The apparatus of any one of EEEs 15-16, wherein the one or more loudspeakers correspond to a left loudspeaker and a right loudspeaker.
18. The apparatus of any one of EEEs 15-17, wherein the apparatus has a form factor of a sound bar.
19. The apparatus of any one of EEEs 15-18, wherein the first room impulse response includes an early response and a late response; and
wherein the first plurality of loudspeaker tunings is based on the early response.
20. The apparatus of any one of EEEs 15-19, wherein the second room impulse response includes an early response and a late response; and
wherein the second plurality of loudspeaker tunings is based on the late response.

The invention claimed is:
1. A method of audio processing, the method comprising:
providing an apparatus having one or more loudspeakers, a memory and a microphone, wherein the memory is configured to store a first plurality of loudspeaker tunings, wherein the first plurality of loudspeaker tunings corresponds to a first room impulse response of the one or more loudspeakers measured in a first room;
outputting, in a second room different from the first room, a plurality of audio signals by the one or more loudspeakers of the apparatus using the first plurality of loudspeaker tunings;
receiving, in the second room, the plurality of audio signals by the microphone of the apparatus;
computing, by the apparatus, a second room impulse response based on the plurality of audio signals having been received by the microphone, wherein the second room impulse response includes an early response and a late response;

computing, by the apparatus, a second plurality of loudspeaker tunings based on the second room impulse response, wherein the second plurality of loudspeaker tunings is based on the late response and excludes the early response;

combining the first plurality of loudspeaker tunings and the second plurality of loudspeaker tunings to generate a third plurality of loudspeaker tunings; and outputting an audio signal by the one or more loudspeakers of the apparatus using the third plurality of loudspeaker tunings.

2. The method of claim 1, wherein the first plurality of loudspeaker tunings results in a flat frequency response of the one or more loudspeakers in the first room.

3. The method of claim 1, wherein different acoustic characteristics between the first room and the second room result in the first room impulse response differing from the second room impulse response.

4. The method of claim 1, wherein the plurality of audio signals output in the second room corresponds to a plurality of exponential sine sweeps.

5. The method of claim 1, wherein the one or more loudspeakers correspond to a left loudspeaker and a right loudspeaker.

6. The method of claim 1, wherein the apparatus has a form factor of a sound bar.

7. The method of claim 1, wherein the one or more loudspeakers includes at least one wireless loudspeaker.

8. The method of claim 1, wherein the first room impulse response includes an early response and a late response; and
wherein the first plurality of loudspeaker tunings is based on the early response.

9. The method of claim 1, wherein the one or more loudspeakers and the microphone are integrated into a single housing of the apparatus.

10. The method of claim 1, wherein combining the first plurality of loudspeaker tunings and the second plurality of loudspeaker tunings is performed in the log domain using an average of the spectral magnitudes of the first plurality of loudspeaker tunings and second plurality of loudspeaker tunings.

11. The method of claim 10, wherein combining the first plurality of loudspeaker tunings and the second plurality of loudspeaker tunings uses first weights associated with the spectral magnitudes of the first plurality of loudspeaker tunings and second weights associated with the spectral magnitudes of second plurality of loudspeaker tunings for obtaining a weighted average.

12. The method of claim 1, wherein the first room impulse response includes an early response and a late response;
wherein combining the first plurality of loudspeaker tunings and the second plurality of loudspeaker tunings to generate the third plurality of loudspeaker tunings is performed by merging the early response of the first room impulse response with the late response of the second room impulse response.

13. The method of claim 1, wherein combining the first plurality of loudspeaker tunings and the second plurality of loudspeaker tunings is performed by splicing the early response of the first room impulse response and the late response of the second room impulse response in either the log-spectral domain or time domain.

14. The method of claim 1, further comprising, prior to the step of providing the apparatus:

outputting, in the first room, a plurality of test signals by the one or more loudspeakers of the apparatus;

receiving, in the first room, the plurality of test signals;

computing the first room impulse response based on the plurality of test signals having been received;

computing the first plurality of loudspeaker tunings based on the first room impulse response; and storing, in the memory of the apparatus, the first plurality of loudspeaker tunings.

15. The method of claim 1, wherein the plurality of audio signals used for computing the second impulse response are generated from general audio output played back by the apparatus, wherein computing the second impulse room response is performed substantially concurrently with playing back the general audio output.

16. An apparatus for audio processing, the apparatus comprising:

one or more loudspeakers;
a microphone;
a processor; and
a memory,
wherein the memory is configured to store a first plurality of loudspeaker tunings, wherein the first plurality of loudspeaker tunings corresponds to a first room impulse response of the one or more loudspeakers measured in a first room;
wherein the processor is configured to control the one or more loudspeakers to output, in a second room different from the first room, a plurality of audio signals using the first plurality of loudspeaker tunings;
wherein the processor is configured to control the microphone to receive, in the second room, the plurality of audio signals;
wherein the processor is configured to compute a second room impulse response based on the plurality of audio signals having been received by the microphone, wherein the second room impulse response includes an early response and a late response;
wherein the processor is configured to compute a second plurality of loudspeaker tunings based on the second room impulse response, wherein the second plurality of loudspeaker tunings is based on the late response and excludes the early response;
wherein the processor is configured to combine the first plurality of loudspeaker tunings and the second plurality of loudspeaker tunings to generate a third plurality of loudspeaker tunings; and
wherein the processor is configured to control the one or more loudspeakers to output an audio signal using the third plurality of loudspeaker tunings.

17. The apparatus of claim 16, wherein the first plurality of loudspeaker tunings results in a flat frequency response of the one or more loudspeakers in the first room.

18. The apparatus of claim 16, wherein the plurality of audio signals output in the second room corresponds to a plurality of exponential sine sweeps.

19. The apparatus of claim 16, wherein the one or more loudspeakers correspond to a left loudspeaker and a right loudspeaker.

20. The apparatus of claim 16, wherein the apparatus has a form factor of a sound bar.

21. The apparatus of claim 16, wherein the first room impulse response includes an early response and a late response; and
wherein the first plurality of loudspeaker tunings is based on the early response.

22. The apparatus of claim 16, wherein the one or more loudspeakers and the microphone are integrated into a single housing of the apparatus.

23. The apparatus of claim 16, wherein the processor is configured to combine the first plurality of loudspeaker tunings and the second plurality of loudspeaker tunings in the log domain using an average of the spectral magnitudes of the first plurality of loudspeaker tunings and second plurality of loudspeaker tunings.

24. The apparatus of claim 23, wherein the processor is configured to associate first weights with the spectral magnitudes of the first plurality of loudspeaker tunings and second weights with the spectral magnitudes of second plurality of loudspeaker tunings, and
to obtain a weighted average of the spectral magnitudes of the first plurality of loudspeaker tunings and second plurality of loudspeaker tunings based on the first weights and the second weights.

25. The apparatus of claim 16, wherein the first room impulse response includes an early response and a late response;
wherein the processor is configured to combine the first plurality of loudspeaker tunings and the second plurality of loudspeaker tunings to generate the third plurality of loudspeaker tunings by merging the early response of the first room impulse response with the late response of the second room impulse response.

26. The apparatus of claim 16, wherein the processor is configured to combine the first plurality of loudspeaker tunings and the second plurality of loudspeaker tunings by splicing the early response of the first room impulse response and the late response of the second room impulse response in the log-spectral domain or time domain.

27. The apparatus of claim 16, wherein the processor is configured to output the plurality of audio signals from general audio output played back by the apparatus, wherein the processor is configured to compute the second impulse room response based on the plurality of audio signals substantially concurrently to the played back general audio output.

28. A non-transitory computer readable medium storing a computer program comprising instructions that, when executed by a processor, controls an apparatus to execute processing including the method of claim 1.

* * * * *